(12) United States Patent
Schleicher et al.

(10) Patent No.: US 8,699,975 B1
(45) Date of Patent: Apr. 15, 2014

(54) DIRECTIONAL COUPLER ARCHITECTURE FOR RADIO FREQUENCY POWER AMPLIFIER

(75) Inventors: Bernd Schleicher, Munich (DE); Ezio Perrone, Munich (DE); Christian Bildl, Munich (DE); Volker Wannenmacher, Munich (DE)

(73) Assignee: TriQuint Semiconductor, Inc., Hillsboro, OH (US)

( * ) Notice: Subject to any disclaimer, the term of this patent is extended or adjusted under 35 U.S.C. 154(b) by 127 days.

(21) Appl. No.: 13/363,905

(22) Filed: Feb. 1, 2012

(51) Int. Cl.
*H04B 1/04* (2006.01)
*H03G 3/30* (2006.01)
*H01P 5/16* (2006.01)

(52) U.S. Cl.
CPC ............... *H03G 3/3042* (2013.01); *H01P 5/16* (2013.01)
USPC ....................................... 455/127.3; 333/109

(58) Field of Classification Search
CPC ................................ H03G 3/3042; H01P 5/16
USPC ................... 455/127.3–127.4; 333/109–116
See application file for complete search history.

(56) References Cited

U.S. PATENT DOCUMENTS

| | | | |
|---|---|---|---|
| 6,141,541 A | 10/2000 | Midya | |
| 6,349,216 B1 | 2/2002 | Alberth | |
| 6,438,360 B1 | 8/2002 | Alberth | |
| 6,759,922 B2 * | 7/2004 | Adar et al. | 333/109 |
| 7,356,309 B2 | 4/2008 | Fifield | |
| 7,446,626 B2 | 11/2008 | Gorbachov | |
| 7,546,089 B2 | 6/2009 | Bellantoni | |
| 2011/0063044 A1 | 3/2011 | Jones | |
| 2011/0279192 A1 * | 11/2011 | Nash et al. | 333/105 |

OTHER PUBLICATIONS

Madic, Jelena, et al.; "Accurate Power Control Technique for Handset PA Modules with Ingtegrated Directional Couplers;" IEEE Radio Frequency Integrated Circuits (RFIC) Symposium, 2003 IEEE; pp. 715-718; Jun. 8-10, 2003.
Mu, Xiaofang, et al.; "Analysis of Output Power Variation under Mismatched Load in Power Amplifier FEM with Directional Coupler;" IEEE Microwave Symposium Digest, 2009; pp. 549-552; MTT '09; IEEE MTT-S International; Jun. 7-12, 2009.
Li, Yang, et al.; A Compact High Directivity Coupler with +0.15dB Error under VSWR 2.5:1 for 3×3mm2 UMTS Power Amplifier Modules; IEEE Radio and Wireless Symposium (RWS), 2010 IEEE; pp. 336-339; Jan. 10-14, 2010.
Mu, Xiaofang, et al.; "Minimizing Radiated Power Variation in Power Amplifier FEMs with Directional Couplers;" Signals Systems and Electronics; International Symposium on Signals Systems and Electronics (ISSSE); vol. 2, pp. 1-3; Sep. 2010.

* cited by examiner

*Primary Examiner* — Lee Nguyen
(74) *Attorney, Agent, or Firm* — Schwabe, Williamson & Wyatt, P.C.

(57) ABSTRACT

Various embodiments may provide a circuit including a radio frequency (RF) power amplification module having an RF power amplifier. The RF power amplification module may further include a directional coupler coupled with the RF power amplifier and configured to produce a power signal at a coupling port of the directional coupler corresponding to an output power of the RF power amplifier. The RF power amplification module may further include a switch coupled between the coupling terminal and a sensing path to selectively couple the coupling port with a power detector via the sensing path. The RF power amplification module may further include a termination load coupled to an isolation port of the directional coupler. Some embodiments may include a plurality of RF power amplification modules coupled together by the sensing path.

19 Claims, 4 Drawing Sheets

DIRECTIONAL COUPLER ARCHITECTURE FOR RADIO FREQUENCY POWER AMPLIFIER

FIELD

Embodiments of the present disclosure relate generally to the field of circuits, and more particularly to a directional coupler architecture for radio frequency power amplifiers.

BACKGROUND

A radio frequency (RF) transmit chain typically includes a RF power amplifier to amplify a signal for transmission within a given frequency band. A directional coupler is coupled with the RF power amplifier to sample an output signal from the RF power amplifier and pass the sampled signal to a power detector. The power detector may determine the output power of the output signal. The output power may be adjusted depending on the detected output power. Many devices include multiple power amplifiers to cover different frequency bands. Each power amplifier is typically coupled with a directional coupler, and the directional couplers are coupled in series with a single power detector.

BRIEF DESCRIPTION OF THE DRAWINGS

Embodiments are illustrated by way of example and not by way of limitation in the figures of the accompanying drawings, in which like references indicate similar elements and in which.

DETAILED DESCRIPTION

Figure 1:
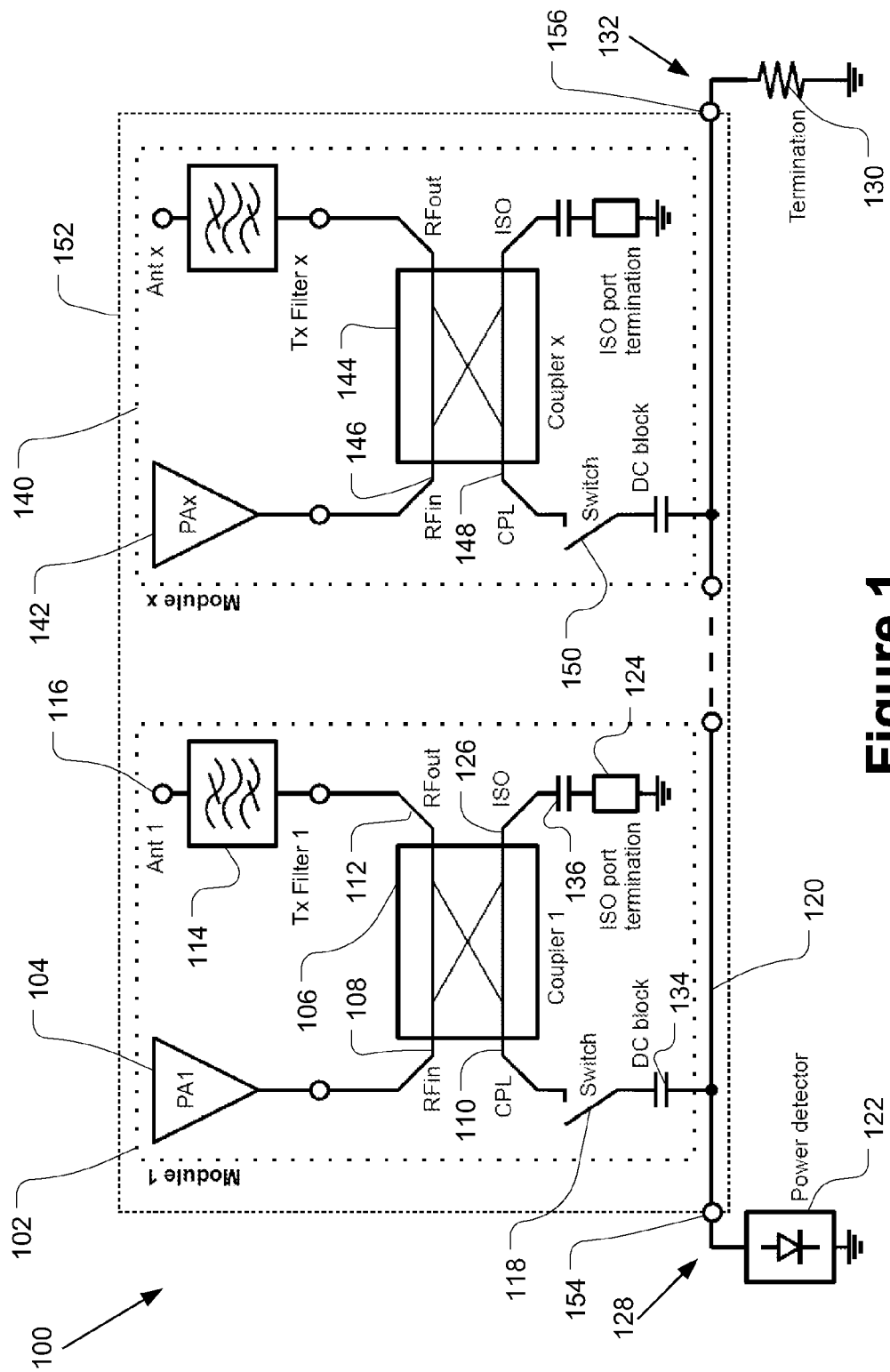
FIG. 1 illustrates a circuit diagram of a plurality of radio frequency (RF) power amplification modules coupled with a power detector in accordance with various embodiments.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present disclosure; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Various embodiments may provide a circuit including a radio frequency (RF) power amplification (PA) module having an RF power amplifier. The RF PA module may further include a directional coupler coupled with the RF power amplifier and configured to produce a power signal at a coupling port of the directional coupler corresponding to an output power of the RF power amplifier. The RF PA module may further include a switch coupled between the coupling terminal and a sensing path to selectively couple the coupling port with a power detector via the sensing path. This configuration may also be referred to as the coupler being coupled "in shunt" with the sensing path via the switch. The RF PA module may further include a termination load coupled to an isolation port of the directional coupler.

Some embodiments may include a plurality of RF PA modules coupled to the same power detector via the sensing path. At least one of the RF PA modules may be configured with the coupler coupled in shunt with the sensing path, as described above. In some embodiments, one or more of the RF PA modules may have the coupler coupled in series with the sensing path (e.g., with the sensing path passing through the coupling port and the isolation port of the coupler).

FIG. 1 illustrates a circuit 100 in accordance with various embodiments. The circuit 100 may include a plurality of RF PA modules including a first RF PA module 102. The first RF PA module 102 may include a RF power amplifier 104 and a coupler 106 (e.g., a directional coupler). The RF power amplifier 104 may receive an RF input signal (e.g., from a transceiver) and produce an amplified RF output signal. The coupler 106 may receive the output signal from the RF power amplifier 104 at an input port 108 (RFin) of the coupler 106. The coupler 106 may produce a power signal at a coupling port 110 (CPL) of the coupler 106 corresponding to an output power of the output signal received from the RF power amplifier 104.

The power signal may have a power that is proportional to the output power of the output signal. For example, in one embodiment, the coupler 106 may have a coupling factor of about 20 decibels (dB). In that case, the power of the power signal at the coupling port 110 may be about one-hundredth (1 percent) of the power of the output signal from the RF power amplifier 104.

The output signal from the RF power amplifier 104 may be passed to an output port 112 (RFout) of the coupler 106 (minus power loss due to the coupler 106). In some embodiments, the first RF PA module 102 may include a filter 114 to suppress spurious emissions such as harmonics and/or noise. The filter 114 may be any suitable type of filter, such as a duplexer to isolate the transmit chain (e.g., including the first RF PA module 102) from the receive chain (not shown). The filter 114 may pass the output signal from the RF power amplifier 104 to an antenna terminal 116. An antenna module (not shown), including an antenna and/or an antenna switch, may be coupled to the antenna terminal 116. Other embodiments of the first RF PA module 102 may not include the filter 114. Some embodiments may include another suitable structure for switching between transmit and/or receive operations. In some embodiments, the output signal may be passed directly from the coupler 106 to the antenna terminal 116.

In various embodiments, the first RF PA module 102 may further include a switch 118 coupled between the coupling port 110 and a sensing line 120 (also referred to as a sensing path). Thus, the coupler 106 may be coupled in shunt with the sensing line 120 by the switch 118. The switch 118 may selectively couple the coupling port 110 with a power detector 122 via the sensing line 120. When the switch is triggered on, the power detector 122 may receive the power signal from the coupling port 110 of the coupler 106, thereby enabling the power detector 122 to determine the output power of the RF power amplifier 104.

In various embodiments, the first RF PA module 102 may further include an internal termination load 124 coupled with an isolation port 126 (ISO) of the coupler 106. In other embodiments, the termination load 124 may be external to the first RF PA module 102. The termination load 124 may present a matched load at the isolation port 126 to provide a termination with little or no reflection. In some embodiments, the termination load 124 may be a complex load. The complex load may compensate for a complex matching network in the RF power amplifier 104 and/or the complex impedance of the filter 114 to facilitate high directivity of the coupler 106. Directivity is related to the isolation of the coupler 106 and is a measurement of relative power between signals at the isolation port 126 compared with signals at the coupling port 110.

In various embodiments, the power detector 122 may be disposed on a first end 128 of the sensing line 120. An external termination load 130 may be coupled to a second end 132 of the sensing line, opposite the first end 128. The external termination load 130 may have an impedance that is matched to the impedance of the power detector 122 and/or a defined system impedance to provide a reflection-free (or low reflection) termination.

In some embodiments, the power detector 122 may have an impedance of about 50 Ohms. In these embodiments, the impedance of the external termination load 130 may also be about 50 Ohms. The impedance of the termination load 124 may be about 25 Ohms, since the impedance at the coupling port 110 may be formed by the parallel connection of the power detector 122 and the external termination load 130.

In various embodiments, the switch 118 may include any suitable structure to selectively couple the coupling port 110 with the sensing line 120. For example, the switch 118 may include one or more transistors, a mechanical switch, and/or a micro-electro-mechanical systems (MEMS) switch. In some embodiments, the RF PA module 102 may include a direct current (DC) blocking element 134 (e.g., one or more capacitors) coupled between the switch 118 and the sensing line 120. The DC blocking element 134 may be used, for example, when the switch 118 includes one or more semiconductor transistors.

In some embodiments, a second DC blocking element 136 may be coupled between the isolation port 126 and the termination 124. In addition to blocking DC currents, the DC blocking element 136 may be used to tune the termination load 124, for example to increase directivity of the coupler 106.

In various embodiments, one or more additional RF PA modules may be coupled to the power detector 122 via the sensing line 120. For example, as shown in FIG. 1, a second RF PA module 140 may be coupled to the power detector 122 via the sensing line 120. In some embodiments, additional RF PA modules may be coupled to the sensing line 120. In other embodiments, the circuit 100 may only include the first and second RF PA modules 102 and 140.

In some embodiments, the second RF PA module 140 may be similar to the first RF PA module 102, as shown in FIG. 1. The second RF PA module 140 may include a second RF power amplifier 142 coupled with a second coupler 144. The second RF power amplifier 142 may operate (e.g., produce an output signal) over a different frequency range from the operating frequency range of the first RF power amplifier 104. For example, the second RF power amplifier 142 may be used to produce output signals over a high frequency band, while the first RF power amplifier 104 may be used to produce output signals over a low frequency band (or vice versa). In some embodiments, the first RF PA module 102 and second RF PA module 140 may be coupled with additional RF PA modules to handle additional frequency ranges.

The second coupler 144 may receive the output signal from the second RF power amplifier 142 at an input port 146 of the second coupler 144 and may produce a power signal at a coupling port 148 of the second coupler 144 that corresponds to the output power of the second RF power amplifier 142. A switch 150 may selectively couple the coupling port 148 of the second coupler 144 to the sensing line 120.

When deployed in conjunction with a transmitter and/or transceiver (as further discussed below), the first RF power amplifier 104 and second RF power amplifier 142 may be turned on at different times (e.g., when transmitting within the frequency band covered by the respective RF power amplifier 104 or 142). The switches 118 and/or 150 may switch on if the respective RF power amplifier 104 or 142 is turned on, thereby allowing the power detector 122 to determine the output power of the transmission.

In conventional RF power amplifier architectures, the couplers of multiple RF PA modules are coupled in series with one another in a daisy-chain, with the sensing line passing through the isolation port and the coupling port of each coupler. The isolation port of one coupler is coupled with the coupling port of the next coupler in the daisy-chain. The power detector is coupled with one side of the sensing line (the coupler port side) and a termination load is coupled on the other side of the sensing line (the isolation port side).

This configuration has several disadvantages. For example, to prevent and/or reduce disturbing the operation of the other couplers, each coupler must be designed to within tight specifications for return loss and insertion loss within the operating frequency range of all of the RF PA modules in the daisy-chain (rather than only within the operating frequency of the individual RF PA module). Furthermore, balancing the specification parameters for each coupler (e.g., specified coupling factor, high directivity, small daisy-chain insertion loss, small daisy-chain return loss, and/or small insertion loss on the transmit path (coupler input port to output port) is difficult. This is especially true considering that geometries of the RF PA modules may be significantly smaller than one-fourth of the wavelength of the operating frequency of the coupler and that the input and output ports of the coupler may see impedances that are different from the common 500 Ohm environment (e.g., from the power amplifier matching network and/or the filter). Accordingly, techniques to improve directivity in a complex terminated environment, such as capacitive and/or inductive loading at the coupler isolation port, could significantly worsen the daisy-chain insertion loss and return loss and therefore cannot be used.

Furthermore, the impedances seen at the coupling port and isolation port may vary depending on the arrangement of the RF PA modules on the circuit board (e.g., a phone board). This may adversely affect the coupling and directivity of the coupler. Additionally, resonances between the filter, the power amplifier matching network, and the coupler may cause dips in the daisy-chain insertion loss in frequencies outside the operating frequency band of the individual RF PA module but inside the total operating frequency band of all of the RF PA modules in the daisy-chain. Also, a parasitic feedback path may open at frequencies outside the operating frequency band of the individual RF PA but inside the total operating frequency band, potentially disturbing the operation of other RF PA modules in their respective operating frequencies.

In contrast, the architecture of the first RF PA module 102 disclosed herein (with a switch 118 between the coupling port 110 and the sensing line 120 and an internal termination load 124 coupled to the isolation port 126) provides a number of advantages compared with the conventional architecture. For example, the switch 118 decouples the coupler 106 from the sensing line 120 when the RF PA module 102 is not in use, which may prevent/reduce resonance dips in the insertion loss along the sensing line 120 and/or prevent/reduce parasitic feedback paths that may disturb the operation of other RF PA modules. Additionally, the coupling factor and directivity of the coupler 106 may be adjusted separately from the insertion loss and return loss along the sensing line 120. Furthermore, the presence of the internal termination 124 (e.g., included in the RF PA module 102) provides a more robust directivity of coupler 106. Each internal termination 124 may be tuned independently to increase directivity and/or other performance factors.

In some embodiments, one or more RF power amplifier modules (e.g., the first RF power amplifier module 102 and the second RF power amplifier module 140) may be included in a package 152. The package 152 may include at least a portion of the sensing line 120 and include a pair of terminals 154 and 156 to couple the first RF power amplifier module 102 and the second RF power amplifier module 140 with the power detector 122 and/or to connect additional packages including additional RF power amplifier modules. The orientation of terminals 154 and 156 with respect to the power detector 122 and/or other RF power amplifier modules may not affect operation of the first and second RF PA modules 102 and 140. Accordingly, the terminals 154 and 156 may be coupled in any suitable orientation (e.g., with terminal 154 closer to the power detector 122 than terminal 156 or vice versa), thereby simplifying placement and/or allowing flexibility in layout of the package 152. In some embodiments, additional packages including additional RF power amplifier modules may be coupled to the package 152 via the sensing line 120 and/or one or more of the terminals 154 and 156.

Figure 2:
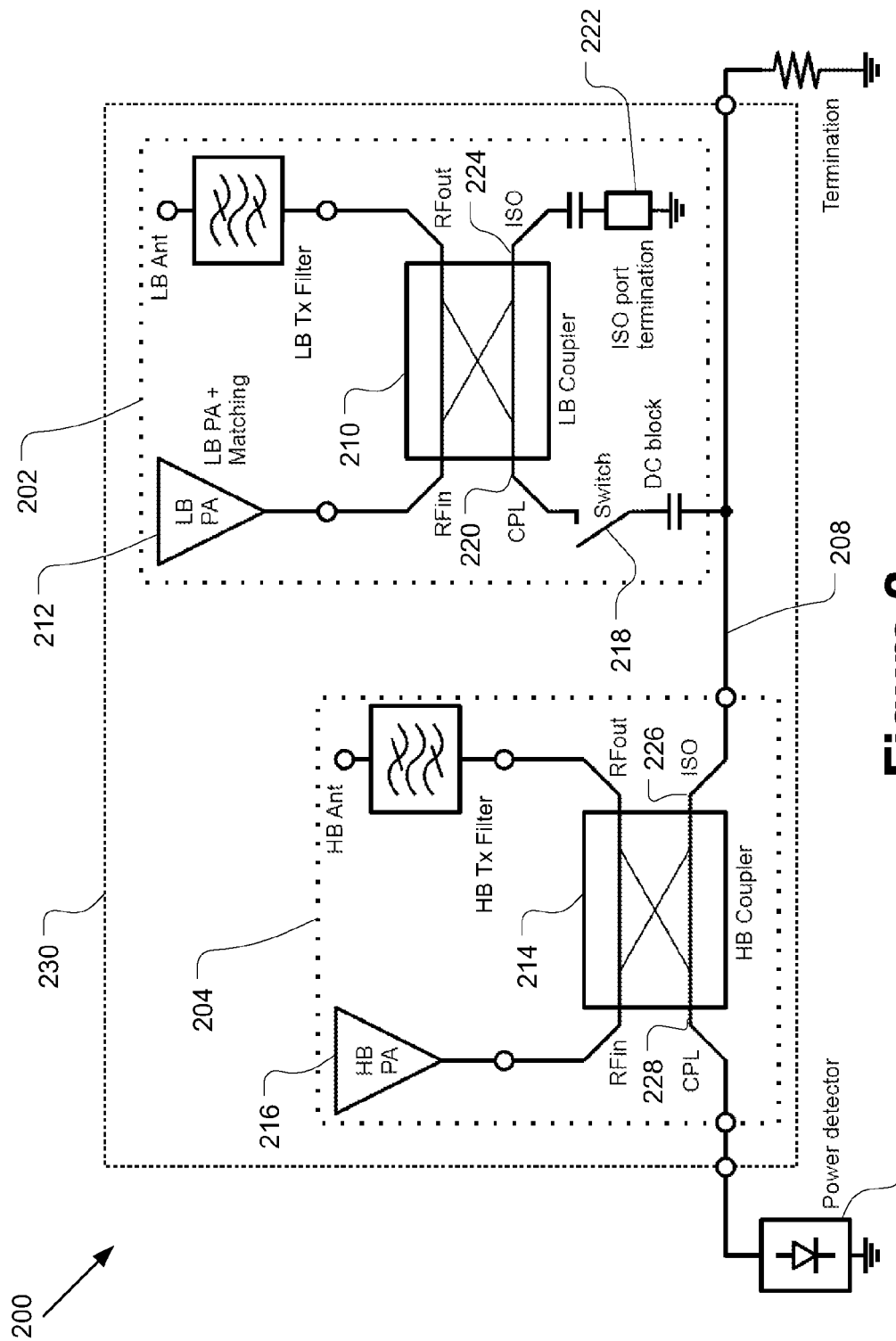
FIG. 2 illustrates an alternative configuration of a plurality of RF power amplification modules coupled with a power detector in accordance with various embodiments.

FIG. 2 illustrates a circuit 200, which shows an alternative configuration to couple a plurality of RF PA modules (including a first RF PA module 202 and a second RF PA module 204) to a power detector 206 via a sensing line 208. The first RF PA module 202 may include a first coupler 210 coupled with a first RF power amplifier 212. The second RF PA module 204 may include a second coupler 214 coupled with a second RF power amplifier 216.

The second RF power amplifier 216 may produce an output signal over a different frequency band than an output signal produced by the first RF power amplifier 212. For example, the second RF power amplifier 216 may operate over a high frequency band (HB), while the first RF power amplifier 212 may operate over a low frequency band (LB). In other embodiments, the second RF power amplifier 216 may operate over a lower frequency band than the first RF power amplifier 212.

The first RF PA module 202 may be similar to RF PA modules 102 and/or 140 shown in FIG. 1. A switch 218 may selectively couple a coupling port 220 of the first coupler 210 with the sensing line 208 to enable the power detector 206 to determine the output power of the first RF power amplifier 212. A termination load 222 may be coupled with an isolation port 224 of the first coupler 210.

In the embodiment shown in FIG. 2, the sensing line 208 may pass through an isolation port 226 and a coupling port 228 of the second coupler 214. In other words, the coupling port 228 and isolation port 226 of the second coupler 214 may be coupled in series with the sensing line 208.

In some embodiments, the first RF PA module 202 and second RF PA module 204 may be included in a same package 230. In some embodiments, additional RF PA modules may be included in the package 230. The additional RF PA modules may include a coupler coupled in shunt with the sensing line 208 (similar to the first coupler 210 of the first RF PA module 202) or a coupler coupled in series with the sensing line 208 (similar to the second coupler 214 of the second RF PA module 204). In some embodiments, additional packages including additional RF power amplifier modules may be coupled to the package 230 via the sensing line 208.

Figure 3:
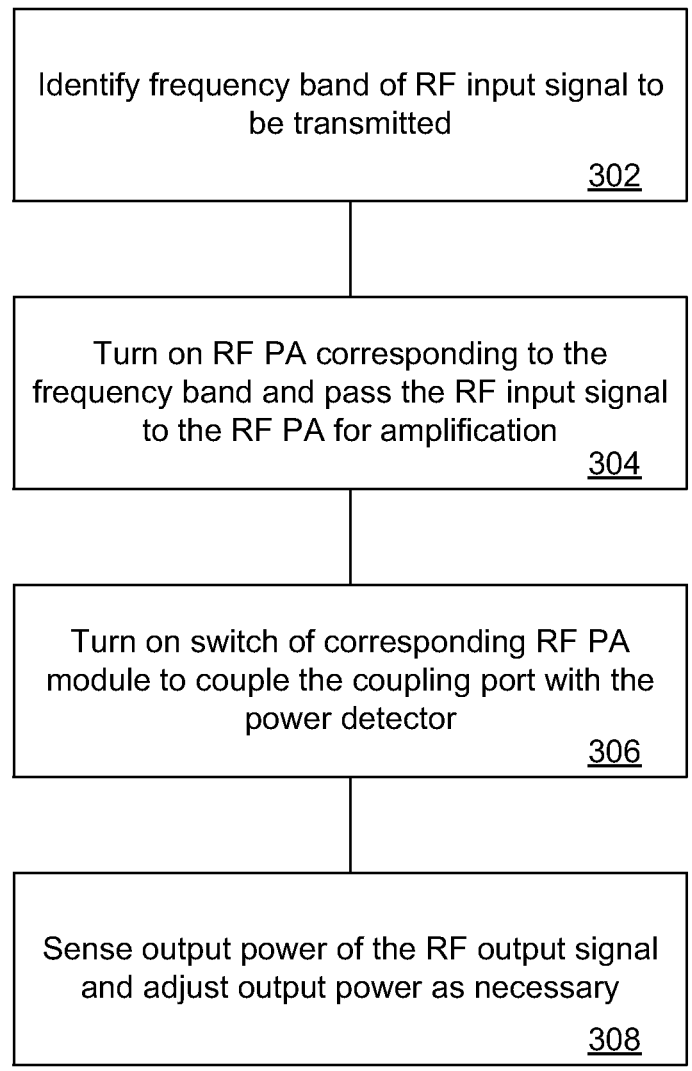
FIG. 3 is a flow diagram of a method of operating a cascaded array of RF power amplification modules in accordance with various embodiments.

FIG. 3 illustrates a block flow diagram of a method 300 in accordance with various embodiments. In some embodiments, the method 300 may be performed by a transceiver coupled with a plurality of RF PA modules. In some embodiments, different operations of the method 300 may be performed by different components.

At 302, the transceiver may identify the frequency band of an RF input signal to be transmitted. At 304, the transceiver may turn on the RF PA module corresponding to the frequency band (e.g., the RF PA module that is designated for amplifying signals within a frequency range that includes the frequency of the input signal), and pass the RF input signal to the RF PA for amplification. Each RF PA module of the plurality of RF PA modules may have a different operating frequency range.

At 306, a switch in the corresponding RF PA module may be turned on. In some embodiments, the switch may be automatically triggered (e.g., turned on) when the RF PA module is turned on (e.g., when the RF PA module receives an RF input signal). The switch may couple a coupler in the RF PA module with a power detector via a sensing path, as described herein.

At 308, the transceiver may sense the output power of the RF output signal produced by the RF PA module (e.g., using the power detector). The transceiver may (or may not) adjust the output power of the RF PA module as necessary depending on the sensed value of the output power. For example, the transceiver may adjust the output power to meet one or more specifications of the communication system, such as maximum radiated power density and/or other parameters. In some embodiments, the output power may be adjusted by increasing and/or decreasing the power of the RF input signal sent to the RF PA module. Alternatively, or additionally, in some embodiments the amplification gain provided by the RF PA module may be adjusted.

The RF PA module may be turned off if the transmission ends and/or if the frequency band of the transmission changes. The switch of the RF PA module may turn off if the RF PA module is turned off, so that the coupler of the RF PA module is decoupled from the sensing path to the power detector.

Figure 4:
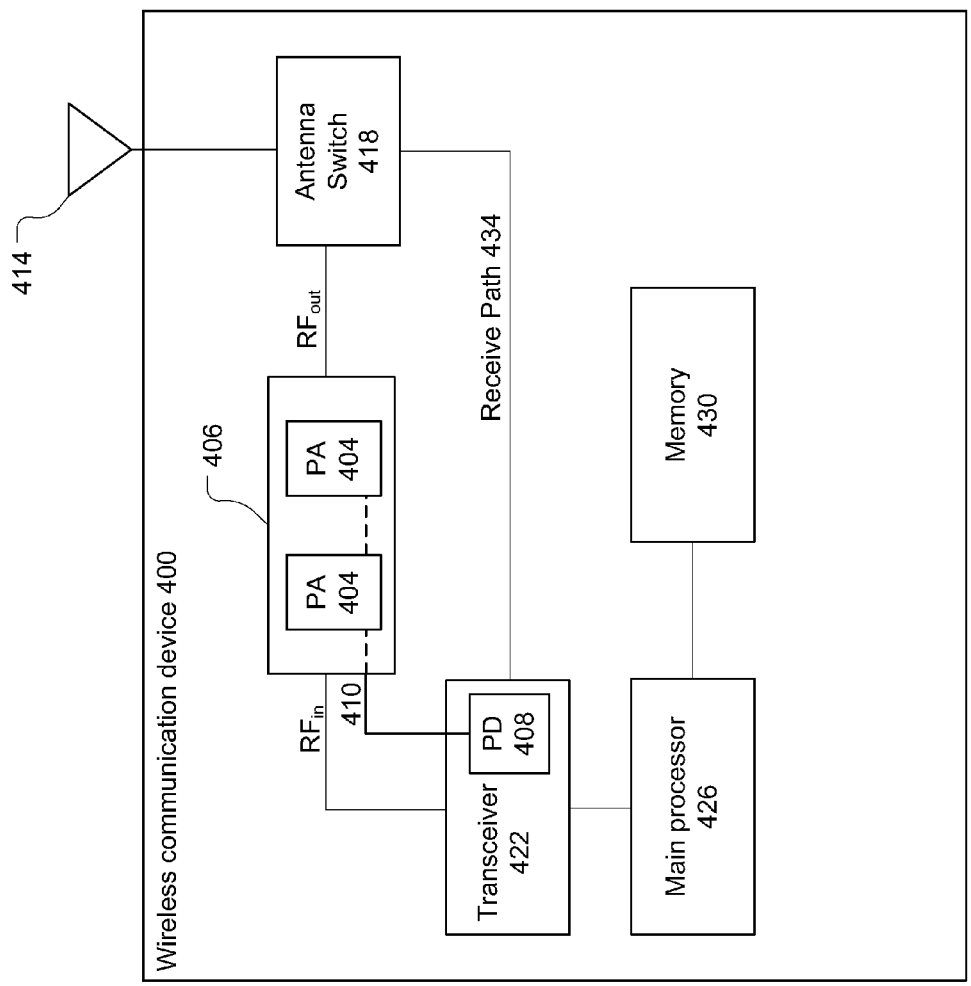
FIG. 4 is a block diagram of an exemplary wireless communication device in accordance with various embodiments.

A block diagram of an exemplary wireless communication device 400 incorporating a plurality of RF PA modules 404, which may be similar to RF PA modules 102, 140, 202, and/or 204, is illustrated in FIG. 4 in accordance with some embodiments. The RF PA modules 404 may be included in a RF PA block 406. In addition to the RF PA modules 404, the wireless communication device 400 may have an antenna structure 414, an antenna switch 418, a transceiver 422, a main processor 426, and a memory 430 coupled with each other at least as shown. While the wireless communication device 400 is shown with transmitting and receiving capabilities, other embodiments may include devices with only transmitting or only receiving capabilities.

In various embodiments, the wireless communication device 400 may be, but is not limited to, a mobile telephone, a paging device, a personal digital assistant, a text-messaging device, a portable computer, a desktop computer, a base station, a subscriber station, an access point, a radar, a satellite communication device, or any other device capable of wirelessly transmitting/receiving RF signals.

The main processor 426 may execute a basic operating system program, stored in the memory 430, in order to control the overall operation of the wireless communication device 400. For example, the main processor 426 may control the reception of signals and the transmission of signals by transceiver 422. The main processor 426 may be capable of executing other processes and programs resident in the memory 430 and may move data into or out of memory 430, as desired by an executing process.

The transceiver 422 may receive outgoing data (e.g., voice data, web data, e-mail, signaling data, etc.) from the main processor 426, may generate the $RF_{in}$ signal(s) to represent the outgoing data, and provide the $RF_{in}$ signal(s) to one or more of the RF PA modules 404. The transceiver 422 may also control the RF PA modules 404 to operate in selected bands and in either full-power or backoff-power modes.

The RF PA module 404 may amplify the $RF_{in}$ signal(s) to provide $RF_{out}$ signal(s) as described herein. The $RF_{out}$ signal(s) may be forwarded to the antenna switch 418 and then to the antenna structure 414 for an over-the-air (OTA) transmission. The antenna switch may enable a plurality of the RF PA modules 404 to transmit using one or more common antennas. In other embodiments, one or more of the RF PA modules 404 may be coupled to a dedicated antenna for the individual RF PA module 404. In that case, the antenna switch 418 may not be included and/or the RF PA module 404 may be coupled directly to the antenna structure 414.

In some embodiments, the RF PA module 404 may include a filter (e.g., a duplexer) to suppress spurious emissions such as harmonics and/or noise, and/or to isolate the transmit chain from the receive chain. In these embodiments, the $RF_{out}$ signal(s) may be routed through the filter. The output of each filter may be coupled with the antenna switch 418.

One or more of the RF PA modules 404 may include a coupler to sample the $RF_{out}$ signal(s) to produce a power signal and to send the power signal to a power detector 408 as described herein. In some embodiments, the power detector 408 may be included in the transceiver 422 as shown. In other embodiments, the power detector 408 may be a separate component from the transceiver 422. The couplers may transmit the power signal to the power detector 408 via a sensing line 410. At least one of the RF PA modules 404 may include a switch between the coupler and the sensing line 410. The switch may be switched on if the RF PA module 404 is active (e.g., used to amplify an $RF_{in}$ signal for transmission), thereby coupling the coupler with the sensing line. The power detector 408 may receive the power signal and determine the power of the $RF_{out}$ signal(s). The transceiver 422 may use this information to adjust the output power of the RF PA module 404.

The wireless communication device 400 may include any suitable number of RF PA modules 404, such as about one to about ten RF PA modules.

The transceiver 422 and/or RF PA block 406 may include logic to select the appropriate RF PA module 404 to amplify the $RF_{in}$ signal(s) based on the frequency of the $RF_{in}$ signal(s), pass the $RF_{in}$ signal(s) to the corresponding RF PA module 304, and/or trigger the switch in the corresponding RF PA module 404 to couple and/or decouple the coupler of the RF PA module 404 with the sensing line (e.g., according to method 300).

In various embodiments, the transceiver 422 may also receive an incoming OTA signal from the antenna structure 414 via a receive path 434. In some embodiments, the receive path 424 may be separated from the transmit path (e.g., including the $RF_{in}$ and $RF_{out}$ signals) by the antenna switch 418 (e.g., for time division duplex (TDD) systems). In other embodiments, both the transmit and receive signals may be passed through the same arm of the antenna switch, and the receive path 424 may be separated from the transmit path by a duplexer (e.g., for frequency division duplex (FDD) systems). The transceiver 422 may process and send the incoming signal to the main processor 426 for further processing.

In various embodiments, the antenna structure 414 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

Those skilled in the art will recognize that the wireless communication device 400 is given by way of example and that, for simplicity and clarity, only so much of the construction and operation of the wireless communication device 400 as is necessary for an understanding of the embodiments is shown and described. Various embodiments contemplate any suitable component or combination of components performing any suitable tasks in association with wireless communication device 400, according to particular needs. Moreover, it is understood that the wireless communication device 400 should not be construed to limit the types of devices in which embodiments may be implemented.

Although the present disclosure has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present disclosure. Those with skill in the art will readily appreciate that the teachings of the present disclosure may be implemented in a wide variety of embodiments. This description is intended to be regarded as illustrative instead of restrictive.

What is claimed is:
1. A circuit comprising:
   a first radio frequency (RF) power amplifier module including:
      a first RF power amplifier;
      a first directional coupler having a coupling port, the first directional coupler coupled with the first RF power amplifier and configured to produce a power signal at the coupling port corresponding to an output power of the first RF power amplifier; and a switch coupled between the coupling port of the first RF power amplifier and a sensing path to selectively couple the coupling port of the first RF power amplifier with a power detector via the sensing path; and a second RF power amplifier module coupled with the sensing line between the power detector and the first RF power amplifier module, the second RF power amplifier module including:

a second RF power amplifier; and a second directional coupler having an input port, an output port, a coupling port, and an isolation port, wherein the second directional coupler is coupled with the second RF power amplifier and configured to produce a power signal at the coupling port of the second directional coupler corresponding to an output power of the second RF power amplifier.

2. The circuit of claim 1, wherein the first directional coupler further includes an isolation port, and the circuit further includes a termination load coupled with the isolation port.

3. The circuit of claim 2, wherein the termination load is a complex load.

4. The circuit of claim 1, further comprising a filter configured to receive an output signal from the first RF power amplifier, and wherein the directional coupler is coupled between the first RF power amplifier and the filter.

5. The apparatus of claim 1, wherein the second RF power amplification module includes a second switch that couples a coupling port of the second directional coupler to the sensing path.

6. The apparatus of claim 1, wherein the sensing path passes through a coupling port and an isolation port of the second directional coupler.

7. The apparatus of claim 1, wherein the switch comprises one or more transistors.

8. A circuit comprising:

a first radio frequency (RF) power amplification module including:

a first RF power amplifier;

a first directional coupler having an input port, an output port, a coupling port, and an isolation port, wherein the first directional coupler is configured to receive an output signal from the first RF power amplifier at the input port and to produce a power signal at the coupling port having a fraction of a power of the output signal; and a first switch configured to selectively couple the coupling port with a power detector through a sensing line; and a second RF power amplification module coupled with the sensing line and including:

a second RF power amplifier; and a second directional coupler having an input port, an output port, a coupling port, and an isolation port, wherein the second directional coupler is configured to receive an output signal from the second RF power amplifier at the input port and to produce a power signal at the coupling port that is proportional to a power of the output signal.

9. The circuit of claim 8, wherein the first RF power amplification module includes a termination load coupled to the isolation port of the first directional coupler.

10. The circuit of claim 9, wherein the termination load is a complex load.

11. The circuit of claim 8, wherein the first RF power amplification module further includes a filter coupled with the output port of the first directional coupler and configured to receive the output signal from the first RF power amplifier.

12. The apparatus of claim 8, wherein the second RF power amplification module further includes a second switch configured to selectively couple the coupling port of the second directional coupler with the power detector.

13. The apparatus of claim 8, wherein the coupling port and isolation port of the second directional coupler is coupled in series with the sensing line.

14. The circuit of claim 8, wherein the first and second RF power amplification modules are included in a same package.

15. A system, comprising:

a transceiver;

a power detector coupled with a first end of a sensing line;

a plurality of radio frequency (RF) power amplification modules coupled with the power detector in a daisy-chain configuration via the sensing line;

wherein individual RF power amplification modules include a power amplifier and a coupler, the coupler being coupled with the power amplifier and configured to produce a power signal at a coupling port of the coupler having a fraction of an output power of the RF power amplifier;

wherein at least one of the plurality of RF power amplification modules includes a switch to selectively couple the coupling port to the sensing line to pass the power signal to the power detector.

16. The system of claim 15, wherein the at least one of the plurality of RF power amplification modules including the switch further includes an isolation load coupled to an isolation port of the coupler.

17. The system of claim 15, further comprising a termination load coupled to a second end of the sensing line, the second end being opposite the first end.

18. The system of claim 15, wherein two or more of the plurality of RF power amplification modules are included in a same package.

19. The system of claim 15, wherein the transceiver, the plurality of RF power amplification modules, and the power detector are included in a wireless communications device.

* * * * *